United States Patent [19]

Torday et al.

[11] 4,456,508

[45] Jun. 26, 1984

[54] TREATMENT OF COPPER FOIL

[75] Inventors: John Torday, Gosforth; Michael E. Bush, Whitley Bay, both of England

[73] Assignee: Torday & Carlisle PLC, North Shields, England

[21] Appl. No.: 425,081

[22] PCT Filed: Feb. 25, 1982

[86] PCT No.: PCT/GB82/00066

§ 371 Date: Sep. 23, 1982

§ 102(e) Date: Sep. 23, 1982

[87] PCT Pub. No.: WO82/02991

PCT Pub. Date: Sep. 2, 1982

[51] Int. Cl.³ .................. C25D 3/22; C25D 3/56; C25D 5/10; C25D 7/06
[52] U.S. Cl. ......................... 204/27; 204/40; 204/43 Z; 204/55 R; 204/140
[58] Field of Search .............. 204/140, 56 R, 43 Z, 204/38 E, 55 R, 27, 40, 43 R, 44

[56] References Cited

U.S. PATENT DOCUMENTS 3,585,010  6/1971  Luce et al. ............................ 204/44
4,049,481  9/1977  Morisaki ........................... 204/43 Z
4,268,364  5/1981  Hall .................................. 204/43 Z

OTHER PUBLICATIONS

Calusaru, "Electrodeposition of Metal Powders", Materials Science Monographs, No. 3, pp. 356–360, (1979).

*Primary Examiner*—T. M. Tufariello
*Attorney, Agent, or Firm*—Cushman, Darby & Cushman

[57]     ABSTRACT

A method of treating copper foil for use in the production of printed circuit boards includes the step of depositing onto the copper foil a layer containing nodular or dendritic zinc in such a manner as to increase the bond strength of the foil with a base material compared with untreated foil.

18 Claims, No Drawings

TREATMENT OF COPPER FOIL

TECHNICAL FIELD

The present invention relates to a method of treating copper foil, which may be rolled or, preferably, electroplated, for use in the production of printed circuit boards to improve the foil's adhesion to a base material, and to laminates formed as a result of said treatment.

BACKGROUND ART

Copper foil used in the manufacture of printed circuit boards is usually bonded to a dielectric base material and various proposals have been made for improving the strength of the bond between the copper foil and the base material.

For example it is now well-established practice to apply copper dendrites to the matt surface of the foil, said dendrites often being reinforced or partially encapsulated with a continuous, coherent layer of copper. Several subsequent electrodeposited layers may then follow to achieve a bond of desired strength and one which will be largely unaffected by soldering. Metallic layers of, for example, zinc, brass or nickel may be present to separate the copper dendrites from the reactive resins in the dielectric base material. It is often difficult to control the size and distribution of the dendrites in the primary copper layer and it has therefore been proposed to add various agents to the copper of said layer in an attempt to effect such control, a preferred additive being arsenic. In such a case, a nodular or dendritic layer of metal comprising an alloy of oxidised copper with arsenic is electrodeposited onto a matt surface of the copper foil from a bath containing copper sulphate and arsenic values.

However reliable control in the growth of the dendrites, particularly the larger dendrites, is still not completely satisfactory.

DISCLOSURE OF THE INVENTION

According to the present invention there is provided a method of treating copper foil including the step of depositing onto the foil at least one nodular or dendritic layer containing zinc whereby the bond strength of the foil with an associated base material is improved.

The or each nodular or dendritic layer may be of zinc or, alternatively, brass.

The method may include the steps of depositing a nodular or dendritic layer of zinc or brass directly onto a matt surface of the foil, and encapsulating said layer with one or more layers of metal such as copper, arsenic, bismuth, brass, bronze, nickel, cobalt or zinc, or alloys/co-deposits of said metals. The presence of such encapsulating layers, which are of continuous, coherent metal as opposed to a powdery or microcrystalline dendritic deposit, can result in an increased peel strength when bonded to glass-epoxy boards compared with foil without such encapsulation of the dendrites, and furthermore ensures that, under conditions of strong resin flow during lamination—such as high pressure and temperature conditions which can cause certain epoxy resins to flow prior to setting hard—no zinc or brass dendrites are detached from the primary layer to become embedded in the resin mass.

The method may further include the step of applying over the primary layer, or the outermost encapsulating layer, a further layer containing zinc. Said further layer is preferably nodular or dendritic and is preferably an alloy of zinc and nickel, although an alloy of zinc and cobalt could be used. The amount of nickel in the alloy is conveniently within the range 3 to 15% and is preferably of the order of 10%. The provision of such a further layer increases the bond strength of the foil with a dielectric base material compared with a foil without said outer layer. Such layers are normally thinner than those applied as the innermost layer next to the basic copper foil matt.

In one method according to the invention, the treatment comprises the steps of depositing onto a matt surface of the foil a first nodular or dendritic layer of zinc, depositing a protective layer of cyanide copper over said first nodular or dendritic layer, depositing an encapsulating layer of pyrophosphate copper over said protective layer of cyanide copper, and depositing a further nodular or dendritic layer of zinc nickel alloy over said encapsulating layer.

Under some laminating conditions, when the temperature may be in excess of 165° C., there can be pronounced interdiffusion between the outermost nodular or dendritic layer of zinc or zinc alloy and the underlying copper layer which produces a canary yellow brass layer. This phenomenon is often accompanied by considerable loss of peel strength.

Accordingly, in a further method there is provided a diffusion-inhibiting layer of metal underlying said further layer containing zinc. The diffusion-inhibiting layer may replace the encapsulating layer of pyrophosphate copper or may be deposited over said encapsulating layer. The diffusion-inhibiting layer may comprise, for example, an alloy of copper with arsenic or bismuth or, alternatively, a weak deposit of pure arsenic or bismuth.

Thus there is provided a treatment which results in the formation of zinc or brass dendrites as the primary adhesion-promoting layer of a copper foil to be laminated to a dielectric substrate, control in the size and distribution of the dendrites being relatively easy to achieve. The preferred zinc dendritic layers can readily be produced from a number of electrolytes of which perhaps the most economical and simple is a relatively dilute solution of sodium zincate. Brass dendrites can conveniently be produced from solution containing sodium zincate and copper salt. In general, the size of the dendrite increases proportionately with increase in zinc concentration, time of plating and current density and inversely with the temperature of the solution.

In methods in which a further, outermost nodular or dendritic layer is provided, there can, under certain circumstances, be problems if pure zinc is used for this layer, particularly if washing between the stages of the process is not perfect. In the case of pure zinc deposited from an alkali bath, there can be difficulties in effecting complete washing of the alkali solution, and any retained solution can interfere with the polymerisation of the epoxy layer and cause a consequent reduction in peel strength.

Further, and as mentioned above, if the outer zinc layer is deposited over a copper-based encapsulating layer, there is a tendency for the pure zinc to react with the copper whereby the zinc is converted into brass, which can result in a variability in peel strength dependent upon the nature of the conversion.

The provision of an outermost nodular or dendritic layer which is an alloy of zinc with nickel tends to obviate these problems, in that the presence of the nickel in said layer slows down or prevents the diffusion of the zinc into the underlying copper and also prevents undercut during etching (the metal of this layer being less soluble than zinc in acid).

A further method of inhibiting the conversion of the zinc of the outer layer into brass, which method may be used instead of or in addition to the incorporation of nickel into the outer layer, is, again as mentioned above, to provide a layer of or containing arsenic underlying said outer layer, although bismuth could be used in place of arsenic. Conveniently such a conversion-inhibiting layer replaces the encapsulating layer of pyrophosphate copper, although it may be included in addition to said encapsulating copper layer between said encapsulating copper layer and the outermost nodular or dendritic layer of zinc or zinc nickel alloy. The presence of such an arsenic-based layer enhances the method by making it less sensitive to contamination which is particularly useful in industrial processes where 100% washing is rarely achieved.

BEST MODES OF CARRYING OUT THE INVENTION

EXAMPLE 1

The following electrodeposited layers were applied to the matt side of an electroformed copper foil 35 microns thick, all formulae being expressed as concentrations in water:

1st Layer

A bath was made up as follows:

| | |
|---|---|
| Zno | 20 g/l |
| NaOH | 90 g/l |
| Current density | 10 amps/sq. dm. |
| Time | 30 secs. |
| Temperature | 25° C. |
| Anode | zinc, or insoluble such as nickel or stainless steel. |

This process produces a fine layer of zinc dendrites which covers the matt structure of the foil, producing the greatest concentration of dendrites on the peaks of the matt.

2nd Layer

Before these dendrites are encapsulated by copper plating, a thin layer of a cyanide-type copper plating is applied to prevent the formation of precipitated copper by the chemical replacement reaction between zinc metal and copper ion. Such a cyanide-type copper layer is conveniently deposited using the following bath:

| | |
|---|---|
| CuCN | 15 g/l |
| NaCN | 23 g/l |
| Na$_2$CO$_3$ | 15 g/l |
| Temperature | 40° C. |
| Current density | 3 amps/sq. dm. |
| Anode | Copper |
| Time | 10 seconds |

3rd Layer

A continuous, coherent layer of copper is then plated on the foil using the following bath:

| | |
|---|---|
| Cu$_2$P$_2$O$_7$ | 25 g/l |
| K$_4$P$_2$O$_7$ | 80 g/l |
| Ammonia | .1 g/l |
| pH | 8.6 |
| Current density | 2 amps/sq. dm. |
| Time | 10 secs |
| Temperature | 25° C. |
| Anode | Copper |

A pink coloured encapsulating plating layer of sound pyrophosphate copper is deposited under the above conditions.

4th Layer

An outer layer of nodular or dendritic zinc/nickel alloy is then formed using the following bath:

| | |
|---|---|
| NiSO$_4$6H$_2$O | 263 g/l |
| ZnSO$_4$7H$_2$O | 137 g/l |
| pH | 5 |
| Current density | 2-8 amps/sq. dm. |
| Anode | Lead or zinc |
| Temperature | 40° C. |
| Time | 10 secs. |

These conditions produce a slightly dendritic final covering layer of zinc/nickel which gives the matt surface a clean dark grey colour.

The foil is well washed by means of water sprays between each treatment stage. The overall process is carried out by passing copper foil in serpentine fashion, using both submersed and free standing rollers, through a series of plating tanks and rinsing stations. The current in each plating tank is separately controlled and the time of plating is determined by the speed of the copper web and the length of the anode used in the particular cell.

Preferably the plated foil is passed through a dilute warm solution of chromic acid which renders the shiny side of the foil passive and provides a shelf life of some months before staining of the foil occurs. This chromate treatment also stabilises the treatment surface and gives a somewhat enhanced peel strength. After treatment the foil is washed, air dried and then reeled up.

Copper foil treated in the above manner, when laminated to epoxy resin impregnated glass cloth sheets under heat and pressure, provides a laminate the peel strength of which is of the order of 5 to 5.5 kp/in. both before and after solder float. The time taken to blister when floated on solder is in excess of 5 mins. Etching with ferric chloride or persulphate type etches gives no undercut. The treatment is firm and produces no "tape transfer" and, even with very reactive resins, there is no evidence of any discolouration showing that the treatment is inert.

It is noteworthy that surprisingly good peel strength is already available after the first layer of zinc dendrite is deposited onto the copper matt. Such a single stage treatment (taking the 1st layer only and passing it through dilute warm chromic acid solution) produces a copper foil having a peel strength of 4–4.2 kp/in. on epoxy glass laminate.

It is to be noted that the provision of an outer layer of zinc nickel alloy substantially inhibits the conversion of said layer into brass. Said layer conveniently incorporates 10% nickel, although this percentage can be adjusted by varying the constituents of the bath.

It is however preferred to keep the percentage of nickel above 3, otherwise the degree of inhibition of conversion reaction is slight, and below 15, otherwise the resultant alloy is not etchable with commercially available etchants.

EXAMPLE 2

A further means of controlling the diffusion of the zinc of the outermost layer into the underlying copper is to provide a layer containing arsenic between the zinc-based and copper-based layers. The first two steps of such a process are identical to those of Example 1, but the third layer is plated from a bath containing copper sulphate solution as follows:

| | |
|---|---|
| Cu (as metal) | 3 to 30 g/l |
| As | 100 to 1000 mg/l |
| $H_2SO_4$ | 50 g/l |
| Temperature | 20° C. |
| Current density | 1–10 amps/sq dm. |
| Anode | Lead |
| Time | 10 seconds |

Such a bath produces a diffusion-inhibiting layer of copper, copper oxide and arsenic, and, if an outermost layer of zinc nickel alloy is electrodeposited as in Example 1, a peel strength of 4.8 to 5.2 kp/inch is achieved with no conversion of the zinc in outermost layer to yellow brass. Further, as is the case in Example 1, the presence of the nickel in the outermost layer prevents any undercutting on etching, even with aggressive etchants such as ferric chloride.

Clearly the third layer could be plated from a solution similar to that above but without copper to give a weak layer of pure arsenic, while the outermost layer, if desired, could be plated from a conventional zinc sulphate bath or any alternative zinc-containing electrolyte to give a layer of zinc.

EXAMPLE 3

In cases where lamination to certain glass epoxy materials is to be effected at temperatures which are somewhat lower than 165° C. and the time for polymerisation is to be relatively short, it may be desirable to utilise a copper foil which has undergone a three-stage treatment as follows:

the first layer is zincate zinc produced as the first layer of Example 1;

the second layer is of cyanide-type copper, as the second layer of Example 1 but the time of plating being 25 seconds at 1 amp/sq. dm;

the third layer is of pure zinc deposited from a zincate solution for 8 seconds at 1 amp/sq. dm.

Under these conditions, the degree of interdiffusion between the outermost zinc dendrites and the underlying copper layer is limited and the resultant peel strength is in the region of 5 kp/inch. The colour of the treatment after lamination is yellow/brown and the undercut after etching is only very slight.

We claim:

1. A method of treating a copper foil characterized by the step of electrodepositing onto the foil at least one nodular or dendritic layer containing zinc whereby the bond strength of the foil with an associated base material is improved.

2. A method of treating copper foil according to claim 1 wherein said nodular or dendritic layer is zinc.

3. A method of treating copper foil according to claim 2 including the steps of electrodepositing a nodular or dendritic layer of zinc directly onto a matt surface of the foil and thereafter encapsulating said layer with one or more layers of metal.

4. A method of treating copper foil according to claim 3 in which the metal of said encapsulating layer is one or more from the group of copper, arsenic, bismuth, brass, bronze, nickel, cobalt or zinc, or alloys or codeposits of said metals.

5. A method of treating copper foil according to either claim 3 or claim 4 and further including the step of applying over the primary, or the outermost encapsulating layer of further layer containing zinc.

6. A method of treating copper foil according to claim 5 in which said further layer containing zinc is nodular or dendritic.

7. A method of treating copper foil according to claim 6 in which the further nodular or dendritic layer is an alloy of zinc and nickel.

8. A method of treating copper foil according to claim 7 in which the amount of nickel in the alloy of said further layer falls within the range 3 to 15%.

9. A method of treating copper foil according to claim 8 and comprising the steps of electrodepositing onto a matt surface of the copper foil a first nodular or dendritic layer of zinc, electrodepositing a protective layer of cyanide copper over said first nodular or dendritic layer, electrodepositing an encapsulating layer of pyrophosphate copper over said protective layer of cyanide copper and electrodepositing a further nodular or dendritic layer of zinc nickel alloy over said encapsulating layer.

10. A method of treating copper foil according to claim 5 and further including the step of electrodepositing a diffusion-inhibiting layer of metal underlying said further layer containing zinc.

11. A method of treating copper foil according to claim 10 in which the diffusion-inhibiting layer contains arsenic.

12. A method of treating copper foil according to claim 11 in which the diffusion-inhibiting layer comprises an alloy of copper with arsenic.

13. A method of treating copper foil according to claim 12 and further comprising the steps of electrodepositing onto a matt surface of the copper foil a first nodular of dendritic layer of zinc, electrodepositing a protective layer of cyanide copper over said first nodular or dendritic layer, electrodepositing a diffusion-inhibiting layer of copper arsenic alloy over said protective layer of cyanide copper and electrodepositing a further nodular or dendritic layer of zinc nickel alloy over said diffusion-inhibiting layer.

14. A method of treating copper foil according to claim 6 and comprising the steps of electrodepositing onto a matt surface of the copper foil a first nodular or dendritic layer of zinc, electrodepositing a protective layer of cyanide copper over said first nodular or dendritic layer of zinc, and electrodepositing a further nodular or dendritic layer of zinc over said protective layer of cyanide copper.

15. Copper foil treated according to the method of claim 1.

16. A laminate comprising a dielectric substrate to which is bonded copper foil treated according to the method of claim 1.

17. A method of treating copper foil according to claim 12 in which the electrodeposition of copper arsenic alloy is conducted at a current density of 1 to 10 amps/sq. dm.

18. A method of treating copper foil according to claim 9 in which the electrodeposition of said further nodular or dendritic layer zinc metal alloy is conducted at a current density of 2 to 8 amsp/sq. dm.

* * * * *